(12) United States Patent
Okubo

(10) Patent No.: US 7,630,616 B2
(45) Date of Patent: Dec. 8, 2009

(54) COIL LOAD DRIVING CIRCUIT AND OPTICAL DISC DEVICE

(75) Inventor: Toshiro Okubo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 311 days.

(21) Appl. No.: 11/569,638

(22) PCT Filed: May 26, 2005

(86) PCT No.: PCT/JP2005/009608

§ 371 (c)(1),
(2), (4) Date: Jul. 25, 2007

(87) PCT Pub. No.: WO2005/117250

PCT Pub. Date: Dec. 8, 2005

(65) Prior Publication Data

US 2008/0019678 A1   Jan. 24, 2008

(30) Foreign Application Priority Data

May 27, 2004   (JP) .............................. 2004-158319

(51) Int. Cl.
H02P 7/29   (2006.01)
(52) U.S. Cl. .................. 388/829; 318/291; 318/293
(58) Field of Classification Search ......... 388/828–831; 318/280, 287, 291, 293
See application file for complete search history.

(56) References Cited

U.S. PATENT DOCUMENTS

| | | | | |
|---|---|---|---|---|
| 4,153,853 A * | 5/1979 | De Villeneuve | ............. | 388/829 |
| 4,160,195 A * | 7/1979 | Sakamoto | ...................... | 318/7 |
| 4,605,887 A * | 8/1986 | Boella et al. | ................. | 318/594 |
| 4,772,994 A * | 9/1988 | Harada et al. | ................... | 363/8 |
| 5,386,182 A * | 1/1995 | Nikami | ....................... | 318/293 |
| 5,450,521 A * | 9/1995 | Redlich | ....................... | 388/829 |
| 6,040,674 A | 3/2000 | Nishida et al. | | |
| 6,825,644 B2 * | 11/2004 | Kernahan et al. | ........... | 323/283 |
| 6,841,983 B2 * | 1/2005 | Thomas | ...................... | 323/322 |
| 2008/0122551 A1* | 5/2008 | Lee et al. | ..................... | 332/109 |

FOREIGN PATENT DOCUMENTS

| | | |
|---|---|---|
| JP | 2000-245192 A | 9/2000 |
| JP | 2001-156611 A | 6/2001 |
| JP | 2003-164194 A | 6/2003 |

OTHER PUBLICATIONS

International Search Report issued in corresponding International Patent application No. PCT/JP2005/009608, mailed Aug. 16, 2005.

* cited by examiner

*Primary Examiner*—Bentsu Ro
(74) *Attorney, Agent, or Firm*—Keating and Bennett, LLP

(57) ABSTRACT

A coil load driving circuit in which generation of radiation noise when a motor is stationary is minimized, includes output buffers that output a PWM pulse to both terminals of a motor; a transfer voltage generating circuit that outputs transfer voltages $V_{TR1}$, $V_{TR2}$ proportional to the difference between an input control voltage $V_{IN}$ and input reference voltage $V_{REF}$; PWM comparators that output PWM signals PW1, PW2 corresponding to the transfer voltages $V_{TR1}$, $V_{TR2}$; and an output PWM pulse synthesis circuit that controls the output buffer in accordance with an AND signal of the PWM signal PW1 and an exclusive OR signal EX of the PWM signals PW1 and PW2, and controls the output buffer in accordance with an AND signal of the PWM signal PW2 and the exclusive OR signal EX.

9 Claims, 9 Drawing Sheets (a)　　　　　　　　　　　　(b)

(a)　　　　　　　　　　　　(b)

(a)   (b)

COIL LOAD DRIVING CIRCUIT AND OPTICAL DISC DEVICE

BACKGROUND OF THE INVENTION

1. Field of the Invention

The present invention relates to a coil load driving circuit that drives a coil load in the positive or negative direction via pulse width modulation (PWM) and also relates to an optical disc device that performs focus adjustment or tracking adjustment using such a coil load driving circuit.

2. Description of the Related Art

As an example of such a coil load driving circuit, there is known (see, for example, Japanese Patent Application Laid-open No. 2003-164194) a coil load driving circuit that controls the torque of a motor by a PWM signal and that controls the forward or reverse direction of rotation of the motor, constituting a coil load, by a polarity signal. An example of such a coil load driving circuit is shown in FIG. 7. This coil load driving circuit 101 inputs an input control voltage $V_{IN}$ through an input terminal IN from outside and inputs an input reference voltage $V_{REF}$ through an input terminal REF, and drives the motor 5 in the forward or reverse direction of rotation by applying a PWM pulse, responsive to the difference between the inputted two voltages, to the either terminal of the motor 5 through a first output terminal $OUT_1$ or second output terminal $OUT_2$. If the first output terminal $OUT_1$ is of positive voltage with respect to the second output terminal $OUT_2$, the motor 5 rotates in the forward direction and if the first output terminal $OUT_1$ is a negative voltage with respect to the second output terminal $OUT_2$, the motor 5 rotates in the reverse direction.

This coil load driving circuit 101 includes a voltage-current converter 131 that outputs a current proportional to the absolute value of the difference of an input control voltage $V_{IN}$ and input reference voltage $V_{REF}$; a bias resistor 132 having one end that is connected with the output of the voltage-current converter 131 and another end that is connected with an adjustment voltage $V_{ADJ}$ of predetermined voltage; a PWM comparator 114 that inputs at its inversion input terminal a triangular wave signal TRI that is output by an oscillator (OSC) 113 and inputs at its non-inversion input terminal a voltage (transfer voltage $V_{TR}$) that is generated by passage of the output current of the voltage-current converter 131 to a bias resistor 132, and that outputs a PWM signal PW as a result of comparing these signals; a polarity comparator 115 that inputs at its inversion input terminal the input reference voltage $V_{REF}$ and inputs at its non-inversion input terminal the input control voltage $V_{IN}$, and that outputs the result of the magnitude comparison of these voltages, i.e. a polarity signal PO indicating the polarity of the input control voltage $V_{IN}$ with respect to the input reference voltage $V_{REF}$; a switch 116 that changes over the output of the PWM signal PW between two paths in accordance with the polarity signal PO; and first and second output buffers 111, 112 that output a PWM pulse to either terminal of the motor 5, being respectively connected to the two paths of the PWM signal PW. The above-described adjustment voltage $V_{ADJ}$ is set to a lower value than the lower end voltage $TRI_{LOW}$ of the triangular wave signal TRI. The switch 116 changes over the PWM signal PW to output to the second output buffer 112 when the polarity signal PO is low-level and changes over the PWM signal PW to output to the first output buffer 111 when the polarity signal PO is high-level, and outputs ground potential on the side where no PWM signal PW is output.

The operation of this coil load driving circuit 101 will now be described with reference to the waveform diagram of FIG. 8. FIG. 8 shows the waveforms at the various sections when the input control voltage $V_{IN}$ rises linearly. Referring to FIG. 8, (a) shows the input control voltage $V_{IN}$, (b) shows the transfer voltage $V_{TR}$ and the triangular wave signal TRI, (c) shows the PWM signal PW, (d) shows the polarity signal PO, (e) shows the PWM pulse of the first output terminal $OUT_1$ and (f) shows the PWM pulse of the second output terminal $OUT_2$. As is clear from this waveform diagram, the transfer voltage $V_{TR}$ IS higher, and the pulse width of the PWM signal PW (i.e., the high-level period) is larger, the higher the difference between the input control voltage $V_{IN}$ and input reference voltage $V_{REF}$. When the input control voltage $V_{IN}$ is lower than the input reference voltage $V_{REF}$, when the input control voltage $V_{IN}$ rises, the transfer voltage $V_{TR}$ falls, and the pulse width of the PWM signal PW gradually becomes smaller. This PWM signal PW, since the polarity signal PO is low-level, is output as a PWM pulse from the second output buffer 112. At this point, the first output buffer 111 is fixed at ground potential. If the input control voltage $V_{IN}$ is higher than the input reference voltage $V_{REF}$, when the input control voltage $V_{IN}$ rises, the transfer voltage $V_{TR}$ rises and the pulse width of the PWM signal PW gradually becomes larger. This PWM signal PW, since the polarity signal PO is high-level, is output as a PWM pulse from the first output buffer 111. At this point, the second output buffer 112 is fixed at ground potential.

In this way, with this coil load driving circuit 101, the torque that drives the motor 5 is controlled by outputting a PWM pulse of a pulse width responsive to the difference between the input control voltage $V_{IN}$ and the input reference voltage $V_{REF}$ from the first output buffer 111 or second output buffer 112. Also, the control to effect forward or reverse rotation of the motor 5 is performed by changing over either of the first output buffer 111 or second output buffer 112 to output the PWM pulse, in accordance with the polarity of the input control voltage $V_{IN}$ with respect to the input reference voltage $V_{REF}$.

Since, in this case, as described above, the adjustment voltage $V_{ADJ}$ is set to be lower than the lower end voltage $TRI_{LOW}$ of the triangular wave signal TRI, an insensitive zone is produced between the lower end voltage $TRI_{LOW}$ of the triangular wave signal TRI and the minimum voltage of the transfer voltage $V_{TR}$. In this insensitive zone, while the absolute value of the difference between the input control voltage $V_{IN}$ and the input reference voltage $V_{REF}$ is no more than a predetermined value, no PWM pulse is output from the first and second output buffers 111, 112. FIG. 9(a) is a characteristic diagram showing the relationship of the transfer voltage $V_{TR}$ and upper end voltage $TRI_{HIGH}$ and lower end voltage $TRI_{LOW}$ of the triangular wave signal TRI with respect to the difference between the input control voltage $V_{IN}$ and the input reference voltage $V_{REF}$ (INPUT on the horizontal axis). FIG. 9(b) is a characteristic diagram of the input/output showing the relationship of the DC voltage (average voltage) (OUTPUT on the vertical axis) between the two terminals of the motor 5 with respect to the difference of the input control voltage $V_{IN}$ and the input reference voltage $V_{REF}$ (INPUT on the horizontal axis). As shown in FIG. 9(b), the coil load driving circuit 101 maintains monotonicity (monotonousness) of the input/output characteristic by providing this insensitive zone. If no insensitive zone were to be provided, i.e. if the lower end voltage $TRI_{LOW}$ of the triangular wave signal TRI and the minimum voltage of the transfer voltage $V_{TR}$ were to coincide, a characteristic diagram as shown in FIGS. 10(a) and 10(b) would be produced. Typically, an amplifier, comparator or voltage-current converter etc that is arranged to deliver output by comparison of two input voltages has some degree of input offset voltage. If there is a relative deviation of the input offset voltage of the voltage-current converter 131 and polarity comparator 115 in the coil load driving circuit 101, as shown in FIG. 10(b), in the vicinity of zero difference between the input control voltage $V_{IN}$ and input reference voltage $V_{REF}$, spurious inversion of the polarity comparator 115 may take place, causing monotonicity of the input/output characteristic to be lost. An insensitive zone is therefore provided by setting the adjustment voltage $V_{ADJ}$ to be lower than the lower end voltage $TRI_{LOW}$ of the triangular wave signal TRI by at least the amount of the input offset voltage.

In this way, monotonicity of the input/output characteristic of the coil load driving circuit 101 is maintained as shown in FIG. 9(b) by providing an insensitive zone. However, linearity is not maintained in the region of small difference of the input control voltage $V_{IN}$ and input reference voltage $V_{REF}$. In order to effect improvement in this respect, a coil load driving circuit described below may be considered.

The coil load driving circuit 201, as shown in FIG. 11, includes a voltage-current converter 231 that inputs an input control voltage $V_{IN}$ at its inversion input terminal and inputs an input reference voltage $V_{REF}$ at its non-inversion input terminal, and that output currents of both positive and negative polarities proportional to the difference of the inputted voltages; two bias resistors 232, 233 having first ends connected with the respective outputs of the voltage-current converter 231 and second ends connected with the center voltage $V_{CEN}$ of the triangular wave signal TRI that is output by an oscillator (OSC) 213; a first PWM comparator 214 that inputs the voltage that is generated by passage of the output current of positive polarity of the voltage-current converter 231 to the bias resistor 232 (first transfer voltage $V_{TR1}$) at its inversion input terminal and that inputs the triangular wave signal TRI at its non-inversion input terminal, and that controls a first output buffer 211, to be described, by outputting a first PWM signal PW1 obtained by comparing these inputted voltage and signal; a second PWM comparator 215 that inputs a voltage generated by passage of output voltage of negative polarity of the voltage-current converter 231 to the bias resistor 233 (second transfer voltage $V_{TR2}$) at its inversion input terminal and that inputs the triangular wave signal TRI at its non-inversion input terminal, and that controls a second output buffer 212, to be described, by outputting a second PWM signal PW2 obtained by comparing these inputted voltage and signal; a first output buffer 211 that outputs a PWM pulse at one terminal of the motor 5, being connected with the downstream end of the first PWM comparator 214; and a second output buffer 212 that outputs a PWM pulse at the other terminal of the motor 5, being connected with the downstream end of the second PWM comparator 215.

The operation of this coil load driving circuit 201 will now be described with reference to the waveform diagram of FIG. 12. FIG. 12 shows the waveform generated at the various sections when the input control voltage $V_{IN}$ is increased linearly. Referring to FIG. 12, (a) shows the input control voltage $V_{IN}$, (b) shows the first and second transfer voltages $V_{TR1}$, $V_{TR2}$ and the triangular wave signal TRI, (c) shows the PWM pulse at the first output terminal $OUT_1$ (i.e. the first PWM signal PW1), (d) shows the PWM pulse at the second output terminal $OUT_2$ (i.e. the second PWM signal PW2). As can be seen from this waveform diagram, when the input control voltage $V_{IN}$ is lower than the input reference voltage $V_{REF}$ and the difference is large, the first transfer voltage $V_{TR1}$ is high and the pulse width of the first PWM signal PW1 (i.e., the high-level period thereof) is small. In contrast, the second transfer voltage $V_{TR2}$ is low and the pulse width of the second PWM signal PW2 (i.e., the high-level period thereof) is large. When the input control voltage $V_{IN}$ rises, the first transfer voltage $V_{TR1}$ falls, causing the pulse width of the first PWM signal PW1 to gradually become larger, and the second transfer voltage $V_{TR2}$ rises, causing the pulse width of the second PWM signal PW2 to become gradually smaller. The first and second PWM signals PW1, PW2 are output as PWM pulses for PWM driving of the motor 5 from the first and second output buffers 211, 212, respectively. Consequently, when the input control voltage $V_{IN}$ is lower than the input reference voltage $V_{REF}$, the pulse width of the second PWM signal PW2 (i.e., the high-level period thereof) is larger than the first PWM signal PW1, so a period is produced in which negative voltage is applied between the two terminals of the motor 5, causing the motor 5 to rotate in the reverse direction. As the input control voltage $V_{IN}$ rises, the period in which negative voltage is applied becomes shorter, so the torque of the motor 5 is decreased. When the input control voltage $V_{IN}$ is higher than the input reference voltage $V_{REF}$, since the pulse width of the first PWM signal PW1 is larger than that of the second PWM signal PW2, a period is produced in which positive voltage is applied between the two terminals of the motor 5, so the motor 5 performs rotation in the forward direction. As the input control voltage $V_{IN}$ rises, this period in which positive voltage is applied becomes longer, so the torque of the motor 5 becomes larger.

In this way, in this coil load driving circuit 201, a first PWM signal PW1 corresponding to the first transfer voltage $V_{TR1}$ that is increased and decreased maintaining monotonicity and linearity, and a second PWM signal PW2 corresponding to the second transfer voltage $V_{TR2}$ that is increased and decreased maintaining monotonicity and linearity are output from the first and second output buffers 211, 212 as PWM pulses to drive the motor 5, in accordance with the difference between the input control voltage $V_{IN}$ and input reference voltage $V_{REF}$. In this coil load driving circuit 201, since evaluation of polarity is not used, as it is in the case of the polarity comparator 115 of the coil load driving circuit 101, there is no possibility of monotonicity or linearity being lost in the vicinity of equality of the input control voltage $V_{IN}$ and the input reference voltage $V_{REF}$, so an input/output characteristic as shown by the characteristic diagram of FIGS. 13(a) and 13(b) can be obtained.

However, typically, considerable radiation noise is produced due to the switching in apparatuses using PWM pulses, so the effects of crosstalk, etc., on other signals becomes a problem. Consequently, counter-measures need to be adopted to reduce the radiation noise as much as possible at the source where this considerable radiation noise is generated. In a coil load driving circuit, the current output capability of an output buffer that outputs a PWM pulse driving a coil load such as a motor is large, so this represents a major source of generation of radiation noise.

In the case of the coil load driving circuit 201 that is devised aiming to maintain linearity in the region of a small difference of the input control voltage $V_{IN}$ and input reference voltage $V_{REF}$ as described above, an input/output characteristic maintaining monotonicity and linearity can indeed be obtained, but, because of the continual switching of the output buffers that output the PWM pulses to the two terminals of the motor, more radiation noise is produced than in the case of the coil load driving circuit 101. In particular, when the motor is stationary, the coil load driving circuit 101 does not output a PWM pulse, but, in the case of the coil load driving circuit 201, PWM pulses of 50% duty are output to the two terminals of the motor. When used, for example, for focus adjustment or tracking adjustment of an optical disc device, the ordinary condition of the motor is that the motor is stationary and so it is undesirable that radiation noise should be generated by continual switching of the output buffers even in this case.

An example of an optical disc device is shown in FIG. 14. In this optical disc device, a focus adjustment coil load driving circuit 511 and a tracking adjustment coil load driving circuit 512 that are included in a servo circuit 501 drive a focus adjustment coil load 513 and a tracking adjustment coil load 514 that are included in the optical pickup 502.

SUMMARY OF THE INVENTION

In order to overcome the problems described above, preferred embodiments of the present invention provide a coil load driving circuit wherein an input/output characteristic maintaining monotonicity and linearity is obtained and generation of radiation noise when the motor or the like constituting the coil load is stationary is minimized.

A coil load driving circuit according to a preferred embodiment of the present invention, that drives a coil load in the positive or negative direction by applying a PWM pulse in accordance with a difference between an input control voltage and an input reference voltage to either terminal of the coil load, includes a transfer voltage generating circuit that inputs the input control voltage and the input reference voltage, and, depending on the difference thereof, outputs a first transfer voltage that increases and decreases about the center voltage of a triangular wave signal that is output by an oscillator and a second transfer voltage that increases and decreases oppositely to the first transfer voltage about the center voltage of the triangular wave signal that is output by the oscillator; a first PWM comparator that outputs a first PWM signal by comparing the first transfer voltage and the triangular wave signal; a second PWM comparator that outputs a second PWM signal by comparing the second transfer voltage and the triangular wave signal; an output PWM pulse synthesis circuit that outputs an AND signal of the first PWM signal with an exclusive OR signal of the first and second PWM signals and that outputs an AND signal of the second PWM signal with the exclusive OR signal of the first and second PWM signals; a first output buffer that can output a PWM pulse at one terminal of the coil load, being controlled by the AND signal of the first PWM signal and the exclusive OR signal; and a second output buffer that can output a PWM pulse at the other terminal of the coil load, being controlled by the AND signal of the second PWM signal and the exclusive OR signal.

Preferably, the transfer voltage generating circuit includes a voltage-current converter that outputs currents of both positive and negative polarity proportional to the difference between the input control voltage and the input reference voltage; and two bias resistors having first ends connected with the respective outputs of the voltage-current converter and second ends connected with the center voltage of the triangular wave signal; the voltages that are generated at the respective first ends of the bias resistors being designated as the first and second transfer voltages.

Alternatively, the transfer voltage generating circuit preferably includes a first inverting amplifier that delivers inverted output of the input control voltage with reference to the input reference voltage, and a second inverting amplifier that delivers further inverted output of the aforementioned output; the center voltage of the triangular wave signal being made to coincide with the input reference voltage and the output of the first inverting amplifier being designated as the first transfer voltage, and the output of the second inverting amplifier being designated as the second transfer voltage.

Preferably, this coil load driving circuit outputs a ground potential at both terminals of the motor in the period outside the pulse period of the PWM pulse.

An optical disc device according to a further preferred embodiment of the present invention includes a coil load driving circuit as described above and a coil load that performs focus adjustment or tracking adjustment driven by the coil load driving circuit.

According to various preferred embodiments of the present invention, since the coil load driving circuit, by means of the output PWM pulse synthesis circuit, outputs an exclusive OR signal of the first and second PWM signals as a PWM pulse only at either of the one or the other terminal of the coil load, an input/output characteristic maintaining monotonicity and linearity is obtained, and generation of radiation noise when the motor or the like constituting the coil load is stationary can be minimized. Also, in an optical disc device using this coil load driving circuit radiation noise is minimized, so stable operation can be performed.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
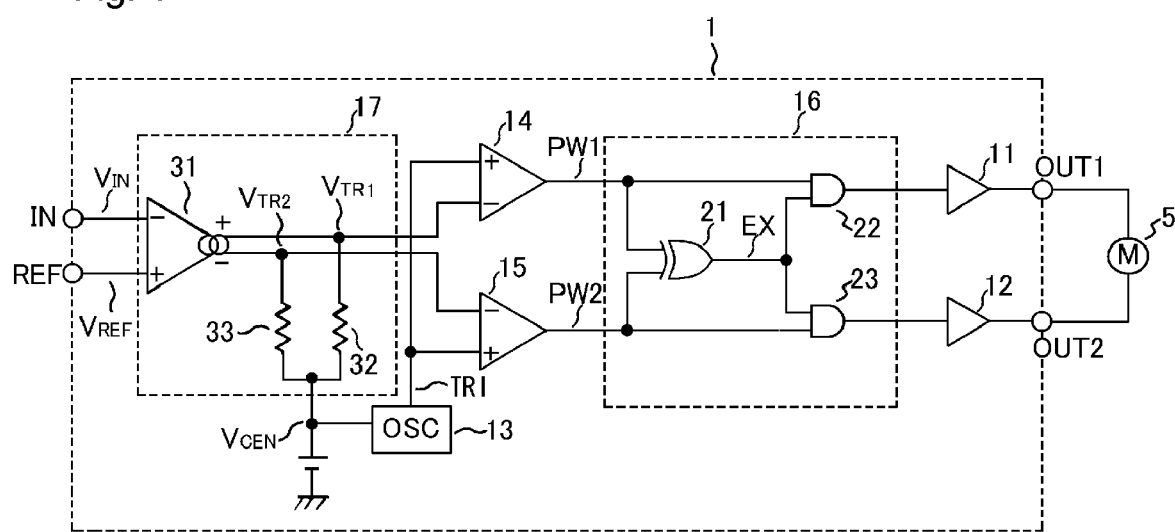
FIG. 1 is a circuit diagram of a coil load driving circuit according to a preferred embodiment of the present invention.

A best mode and various preferred embodiments of the present invention are described below with reference to the drawings. FIG. 1 is a circuit diagram of a coil load driving circuit according to a preferred embodiment of the present invention. In this coil load driving circuit 1, an input control voltage $V_{IN}$ is input through an input terminal IN from outside and an input reference voltage $V_{REF}$ is input through an input terminal REF, and a PWM pulse in accordance with the voltage difference thereof is applied across the two terminals of the motor 5 constituting the coil load, through a first output terminal $OUT_1$ or second output terminal $OUT_2$. The motor 5 is thereby driven in the positive or negative direction, i.e., the forward or reverse direction. The motor 5 is driven in the forward direction of rotation if the first output terminal $OUT_1$ is of positive voltage with respect to the second output terminal $OUT_2$ and is driven in the reverse direction if the first output terminal $OUT_1$ is of negative voltage with respect to the second output terminal $OUT_2$. It should be noted that, although, in the present preferred embodiment, the coil load is described as being a rotating motor, the coil load is not restricted to this and could be a linearly or curvilinearly moving load (for example, as in the case of an actuator).

The coil load driving circuit 1 preferably includes a transfer voltage generating circuit 17 that inputs an input control voltage $V_{IN}$ and input reference voltage $V_{REF}$ and, depending on the difference thereof, outputs a first transfer voltage $V_{TR1}$ that increases and decreases about the center voltage $V_{CEN}$ of a triangular wave signal TRI that is output by an oscillator (OSC) 13 and a second transfer voltage $V_{TR2}$ that increases and decreases oppositely to the first transfer voltage $V_{TR1}$ about the center voltage $V_{CEN}$ of the triangular wave signal TRI; a first PWM comparator 14 that inputs the first transfer voltage $V_{TR1}$ at its inversion input terminal and inputs the triangular wave signal TRI at its non-inversion input terminal, and that compares these inputted voltage and signal and outputs a first PWM signal PW1; a second PWM comparator 15 that inputs the second transfer voltage $V_{TR2}$ at its inversion input terminal and the triangular wave signal TRI at its non-inversion input terminal, and that compares these inputted voltage and signal and outputs a second PWM signal PW2; an output PWM pulse synthesis circuit 16 that outputs an AND signal of the first PWM signal PW1 with an exclusive OR signal EX of the first and second PWM signals PW1 and PW2 and that outputs an AND signal of the second PWM signal PW2 with the exclusive OR signal EX of the first and second PWM signals PW1 and PW2; a first output buffer 11 that outputs a PWM pulse at one terminal of the motor 5, being controlled by the AND signal of the first PWM signal PW1 and the exclusive OR signal EX; and a second output buffer 12 that outputs a PWM pulse at the other terminal of the motor 5, being controlled by the AND signal of the second PWM signal PW2 and the exclusive OR signal EX.

The transfer voltage generating circuit 17 preferably includes a voltage-current converter 31 that inputs the input control voltage $V_{IN}$ at its inversion input terminal and inputs the input reference voltage $V_{REF}$ at its non-inversion input terminal and that outputs currents of both positive and negative polarity proportional to the difference of these inputted voltages; a bias resistor 32 having a first end connected with a terminal that outputs the current of positive polarity of the voltage-current converter 31 and a second end connected with the center voltage $V_{CEN}$ of the triangular wave signal TRI, and a bias resistor 33 having a first end connected with a terminal that outputs the current of negative polarity of the voltage-current converter 31 and a second end connected with the center voltage $V_{CEN}$ of the triangular wave signal TRI. The output current of positive polarity of the voltage-current converter 31 is passed to the bias resistor 32 and the voltage that is thereby generated at one end thereof is designated as the first transfer voltage $V_{TR1}$. The output current of negative polarity of the voltage-current converter 31 is passed to the bias resistor 33 and the voltage that is thereby generated at the one end thereof is designated as the second transfer voltage $V_{TR2}$. When the input control voltage $V_{IN}$ is lower than the input reference voltage $V_{REF}$, the voltage-current converter 31 outputs a current of positive polarity such that the voltage that is generated in the bias resistor 32 (first transfer voltage $V_{TR1}$) is positive with respect to the center voltage $V_{CEN}$ and outputs a current of negative polarity such that the voltage that is generated in the bias resistor 33 (second transfer voltage $V_{TR2}$) is negative with respect to the center voltage $V_{CEN}$. On the contrary, when the input reference voltage $V_{IN}$ is higher than the input reference voltage $V_{REF}$, the voltage-current converter 31 outputs a current of positive polarity such that the voltage that is generated in the bias resistor 32 (first transfer voltage $V_{TR1}$) is negative with respect to the center voltage $V_{CEN}$ and outputs a current of negative polarity such that the voltage that is generated in the bias resistor 33 (second transfer voltage $V_{TR2}$) is positive with respect to the center voltage $V_{CEN}$.

The output PWM pulse synthesis circuit 16 preferably includes an EOR circuit 21 that outputs an exclusive OR signal EX of the first and second PWM signals PW1, PW2; an AND circuit 22 that outputs an AND signal of the first PWM signal PW1 and the exclusive OR signal EX; and an AND circuit 23 that outputs an AND signal of the second PWM signal PW2 and the exclusive OR signal EX. Consequently, the AND signal that is output by the AND circuit 22 is input to the first output buffer 11 and the AND signal that is output by the AND circuit 23 is input to the second output buffer 12.

Figure 2:
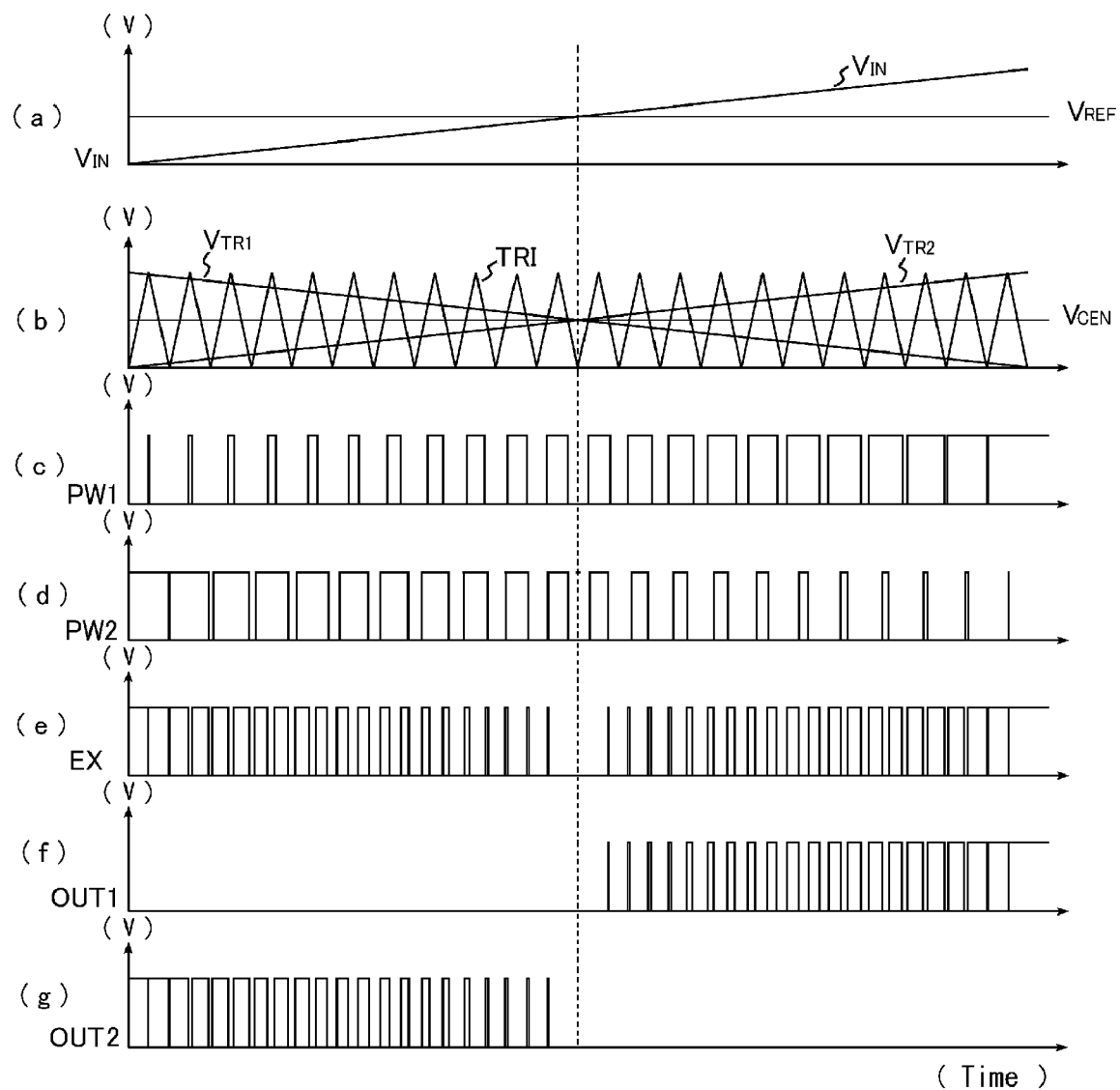
FIG. 2 is a waveform diagram showing the waveforms generated at the various sections of the preferred embodiment of the present invention shown in FIG. 1.

The operation of this coil load driving circuit 1 will now be described with reference to the waveform diagram of FIG. 2. FIG. 2 shows the waveforms that are generated at the various sections when the input control voltage $V_{IN}$ rises linearly. In FIG. 2, (a) shows the input control voltage $V_{IN}$, (b) shows the first and second transfer voltages $V_{TR1}$, $V_{TR2}$ and the triangular wave signal TRI, (c) shows the first PWM signal PW1, (d) shows the second PWM signal PW2, (e) shows the exclusive OR signal EX, (f) shows the PWM pulse of the first output terminal $OUT_1$, and (g) shows the PWM pulse of the second output terminal $OUT_2$. As is clear from this waveform diagram, when the input control voltage $V_{IN}$ is lower than the input reference voltage $V_{REF}$ and the difference is large, the first transfer voltage $V_{TR1}$ is high and the pulse width of the first PWM signal PW1 (i.e. its high-level period) is small. On the contrary, the second transfer voltage $V_{TR2}$ is low, and the pulse width of the second PWM signal PW2 (i.e., its high-level period) is large. When the input control voltage $V_{IN}$ rises, the first transfer voltage $V_{TR}$ falls, causing the pulse width of the first PWM signal PW1 to gradually increase and the second transfer voltage $V_{TR2}$ rises, causing the pulse width of the second PWM signal PW2 to gradually decrease.

When the input control voltage $V_{IN}$ is lower than the input reference voltage $V_{REF}$, the pulse width of the exclusive OR signal EX gradually becomes smaller as the input control voltage $V_{IN}$ rises. When the control voltage $V_{IN}$ has become equal to the input reference voltage $V_{REF}$, the pulse widths of the first and second PWM signals PW1, PW2 coincide, both having a duty ratio of 50%, i.e., the pulse width of the exclusive OR signal EX becomes 0. And when the input control voltage $V_{IN}$ is higher than the input reference voltage $V_{REF}$, the pulse width gradually becomes larger as the input control voltage $V_{IN}$ rises.

Also, at the first and second output terminals $OUT_1$, $OUT_2$, a PWM pulse is output on the side where the pulse width is the larger between the first and second PWM signals PW1, PW2. Specifically, when the input control voltage $V_{IN}$ is lower than the input reference voltage $V_{REF}$, a PWM pulse is output from the second output terminal $OUT_2$, and no PWM pulse is output from the first output terminal $OUT_1$, which is fixed at ground potential. In this case, the motor 5 rotates in the reverse direction. When the input control voltage $V_{IN}$ is higher than the input reference voltage $V_{REF}$, a PWM pulse is output from the first output terminal $OUT_1$ and the second output terminal $OUT_2$ is fixed at ground potential. In this case, the motor 5 rotates in the forward direction. And when the input control voltage $V_{IN}$ is equal to the input reference voltage $V_{REF}$, the first and second output terminals $OUT_1$, $OUT_2$ are both fixed at ground potential, so that the motor 5 is stationary. It should be noted that, as the difference between the input control voltage $V_{IN}$ and the input reference voltage $V_{REF}$ becomes larger, the pulse width of the PWM pulse that is output from the first output terminal $OUT_1$ or second output terminal $OUT_2$ becomes larger, causing the torque that drives the motor 5 to become larger.

Figure 13:
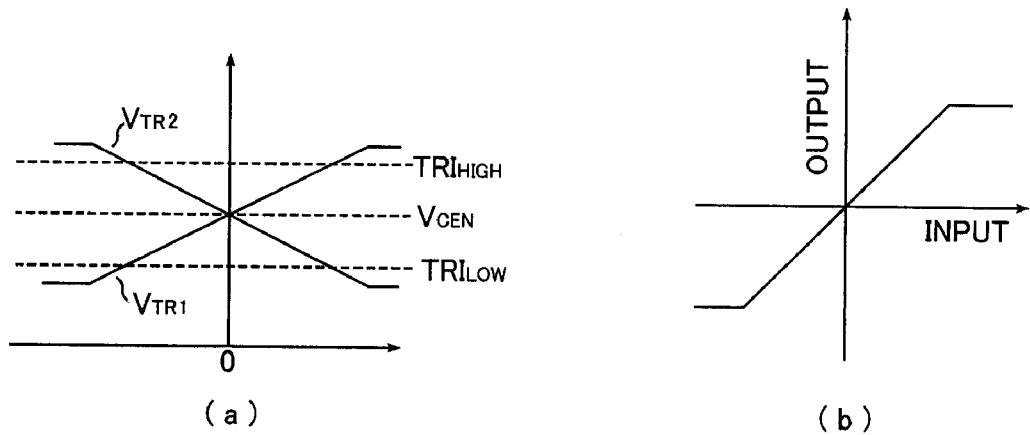
FIG. 13 is a diagram showing the characteristics of a coil load driving circuit, wherein (a) shows the characteristics of the first and second transfer voltages, and (b) shows the characteristic of the input/output showing the DC voltage across the two terminals of the motor.
Figure 14:
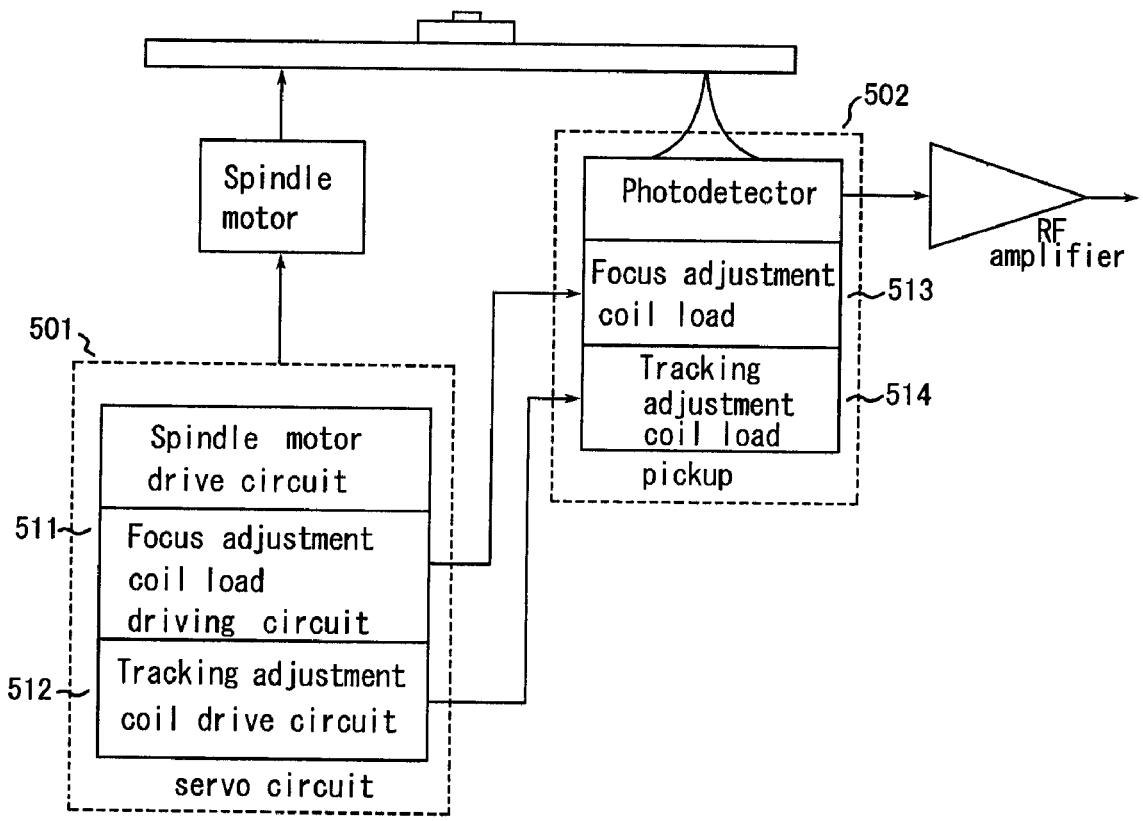
FIG. 14 is a block diagram of a typical optical disc device.

Thus, with this coil load driving circuit 1, depending on the difference between the input control voltage $V_{IN}$ and the input reference voltage $V_{REF}$, the exclusive OR of the first PWM signal PW1 corresponding to the first transfer voltage $V_{TR1}$ that increases and decreases maintaining monotonicity and linearity, and the second PWM signal PW2 corresponding to the second transfer voltage $V_{TR2}$ that increases and decreases maintaining monotonicity and linearity, in other words, the absolute value of the difference, is output only to one or the other of the terminals of the motor 5 as a PWM pulse. Thus, with this coil load driving circuit 1, there is no possibility of monotonicity or linearity being lost in the vicinity of where the input control voltage $V_{IN}$ and input reference voltage $V_{REF}$ become equal so, just as in the case of the coil load driving circuit 201 described above in the background art, input/output performance can be obtained as shown by the characteristic views of FIGS. 13(a) and 13(b). In addition, in a condition where the input control voltage $V_{IN}$ and input reference voltage $V_{REF}$ are equal, i.e., in which the motor 5 is stationary, the first and second output terminals $OUT_1$, $OUT_2$ are both fixed at ground potential, with no PWM pulse being output, so generation of radiation noise due to switching of the first and second output buffers 11, 12 can be minimized.

Figure 3:
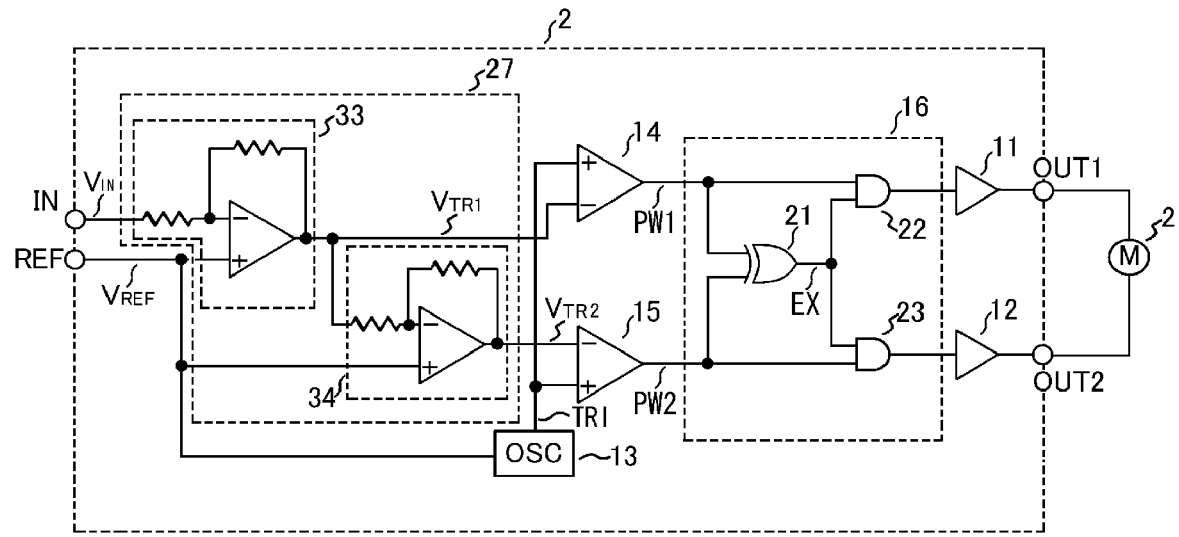
FIG. 3 is a circuit diagram of a coil load driving circuit according to another preferred embodiment of the present invention.

Next, a coil load driving circuit according to another preferred embodiment of the present invention will be described. In this coil load driving circuit 2, as shown by the circuit diagram of FIG. 3, the transfer voltage generating circuit 17 in the coil load driving circuit 1 is replaced by a transfer voltage generating circuit 27, and the center voltage $V_{CEN}$ of the triangular wave signal TRI is made to coincide with the input reference voltage $V_{REF}$. This transfer voltage generating circuit 27 preferably includes a first inverting amplifier 33 that provides inverted output of the input control voltage $V_{IN}$ at its input terminal IN with reference to the input reference voltage $V_{REF}$ of its input terminal REF, and a second inverting amplifier 34 that provides output wherein the foregoing output is again inverted. Thus, the output of the first inverting amplifier 33 becomes the first transfer voltage $V_{TR1}$ and the output of the second inverting amplifier 34 becomes the second transfer voltage $V_{TR2}$. The operation of the coil load driving circuit 2 produces the same waveform as in the case of FIG. 2 described above. Although, with this coil load driving circuit 2, it is necessary to generate a triangular wave signal TRI whose center voltage $V_{CEN}$ coincides with the input reference voltage $V_{REF}$, two inverting amplifiers 33, 34 are used and have a smaller circuit size than the voltage-current converter, so the overall size of the circuitry can be reduced.

Figure 4:
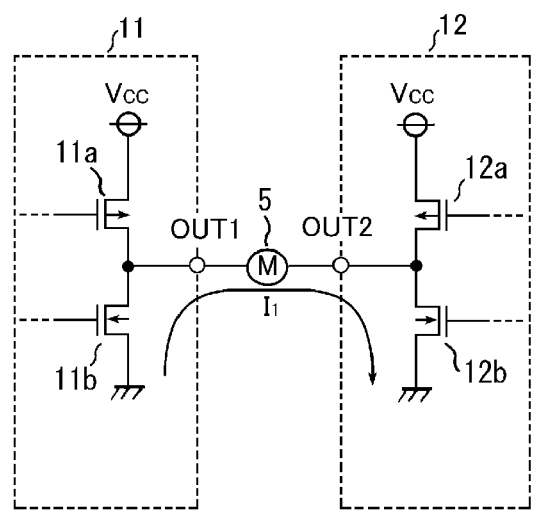
FIG. 4 is a diagram for explaining the regeneration current flowing in the motor.

It should be noted that, in the case of the coil load driving circuits 1 and 2 described above, voltage is applied between the two terminals of the motor 5 in the pulse period (high-level period) of the PWM pulse that is output from the first output terminal $OUT_1$ or second output terminal $OUT_2$, causing current to flow in the direction of this voltage. In the period outside this pulse period (the low-level period), the two terminals of the motor 5 are fixed at ground potential, so no voltage is applied between the two terminals of the motor 5, but, due to the inductive properties of the motor 5, during this period, current continues to flow. As a result, so-called regenerated current flows. As shown in FIG. 4, in the case where the output transistors 11a, 12a on the power supply voltage Vcc side of the first and second output buffers 11, 12 are P-type MOS transistors, and the output transistors 11b, 12b on the ground potential side are N-type MOS transistors, when the PWM pulse is output from the first output terminal $OUT_1$, regenerated current $I_1$ flows from the output transistor 11b of the first output buffer 11 to the output transistor 12b of the second output buffer 12 through the motor 5 during the period (the low-level period) outside the pulse period. In general, the ON resistance of an N-type MOS transistor is smaller than the ON resistance of a P-type MOS transistor, so if regenerated current is made to flow in an N-type MOS transistor, the power consumption is smaller than in the case where the regenerated current is made to flow in a P-type MOS transistor. Consequently, the coil load driving circuits 1 and 2 are advantageous in power consumption compared with the above-described coil load driving circuit 201, in which it is possible for regenerated current to flow to both N-type MOS transistors and P-type MOS transistors. The same applies in a construction in which the N-type MOS transistors are replaced by NPN-type bipolar transistors and the P-type MOS transistors are replaced by PNP-type bipolar transistors.

Figure 5:
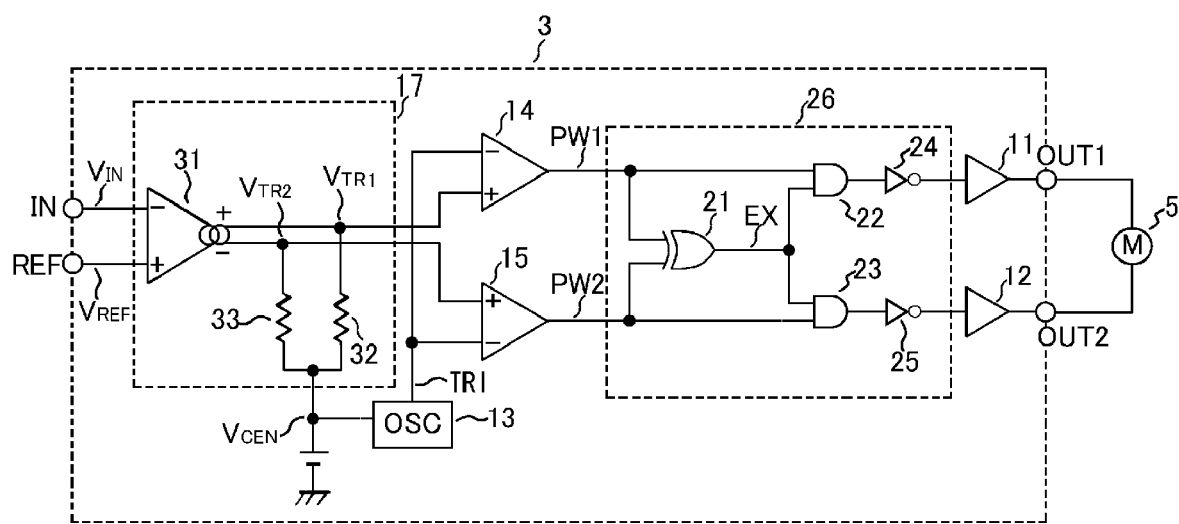
FIG. 5 is a circuit diagram of a coil load driving circuit according to yet a further preferred embodiment of the present invention.
Figure 6:
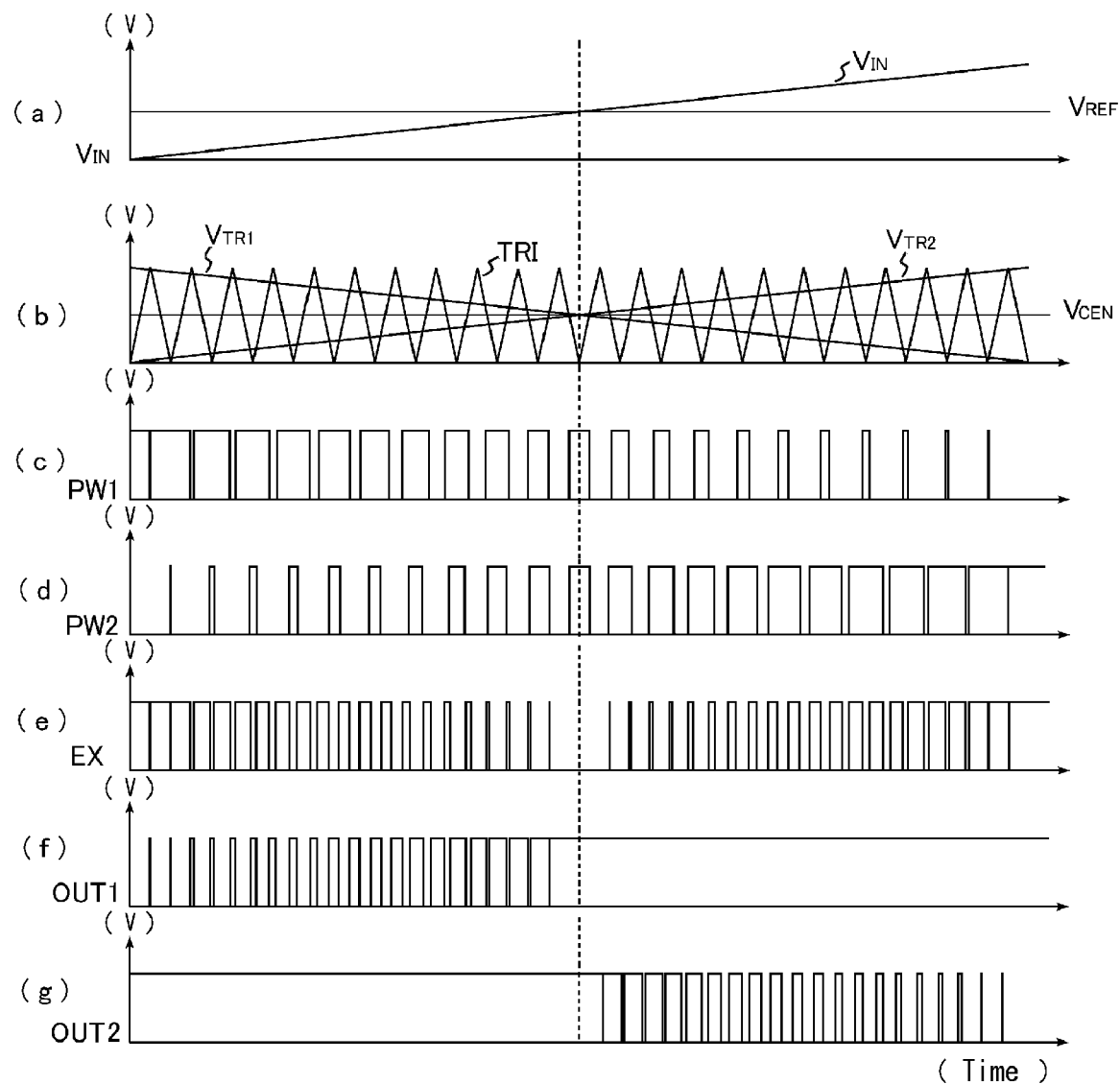
FIG. 6 is a waveform diagram showing the waveforms generated at the various sections of the preferred embodiment of the present invention shown in FIG. 5.
Figure 7:
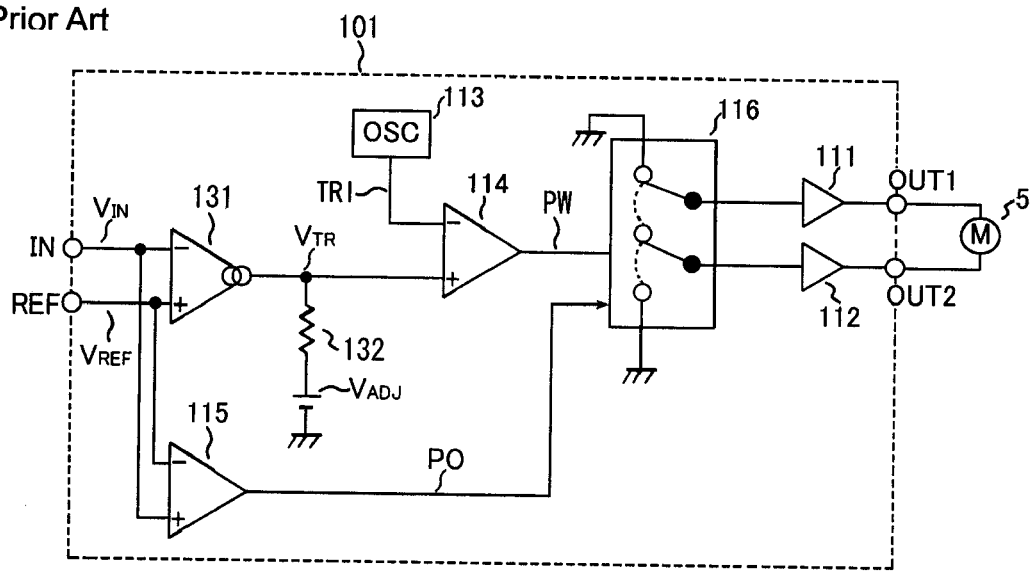
FIG. 7 is a circuit diagram of a conventional coil load driving circuit.
Figure 8:
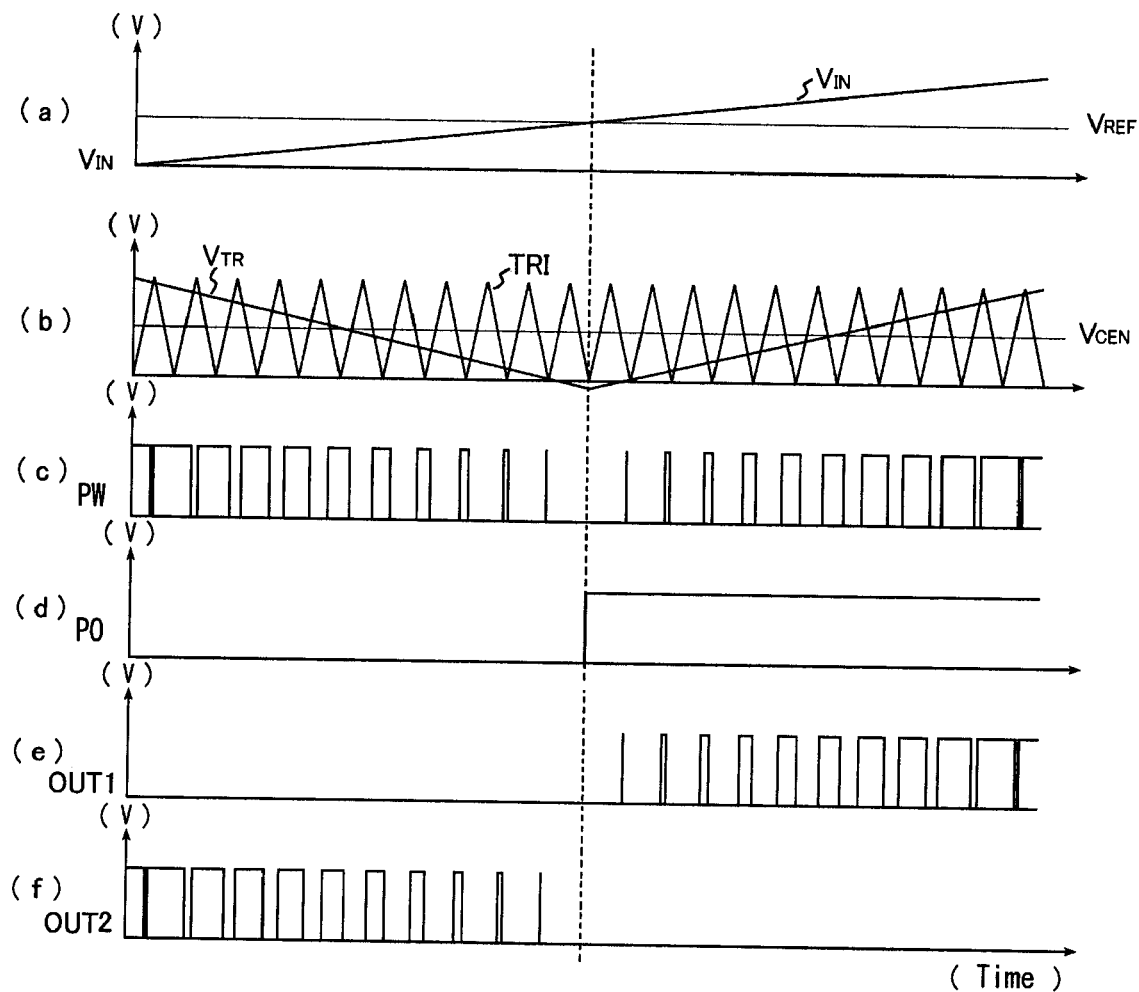
FIG. 8 is a waveform diagram showing the waveforms generated at the various sections of the conventional coil load driving circuit of FIG. 7.
Figure 9:
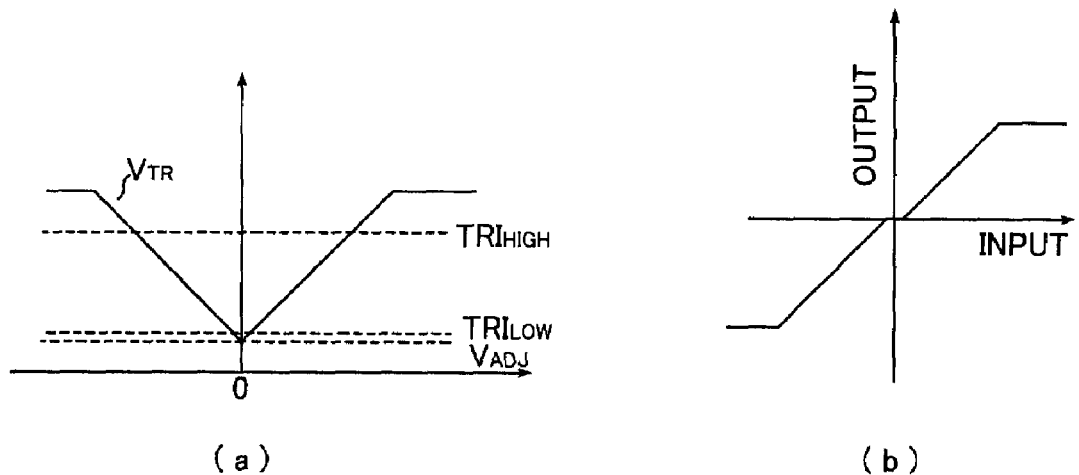
FIG. 9 is a diagram showing the characteristics of the conventional coil load driving circuit of FIG. 7, wherein (a) shows the characteristic of the transfer voltage, and (b) shows characteristic of the input/output showing the DC voltage across the two terminals of the motor.
Figure 10:
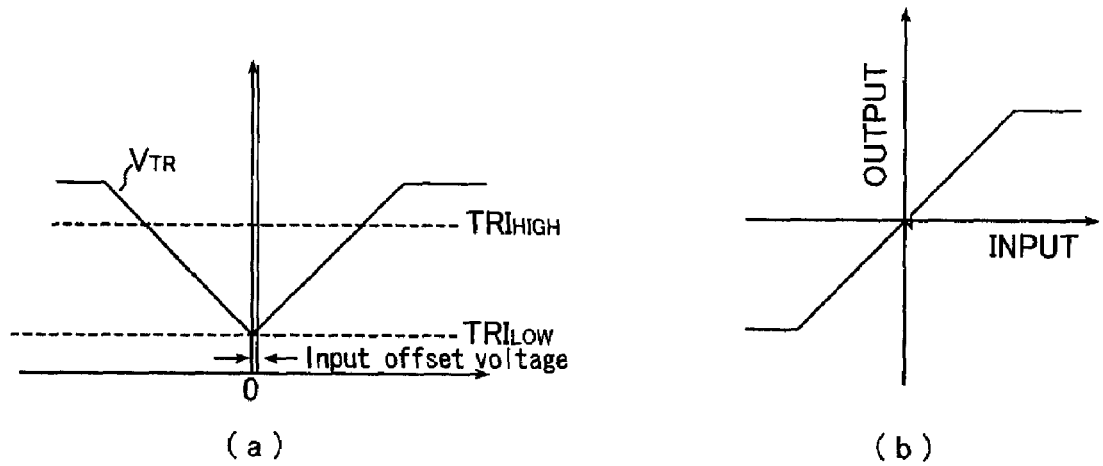
FIG. 10 is a diagram showing characteristics compared with the characteristic shown in FIG. 9, wherein (a) shows the characteristic of the transfer voltage, and (b) shows the characteristic of the input/output showing the DC voltage across the two terminals of the motor.
Figure 11:
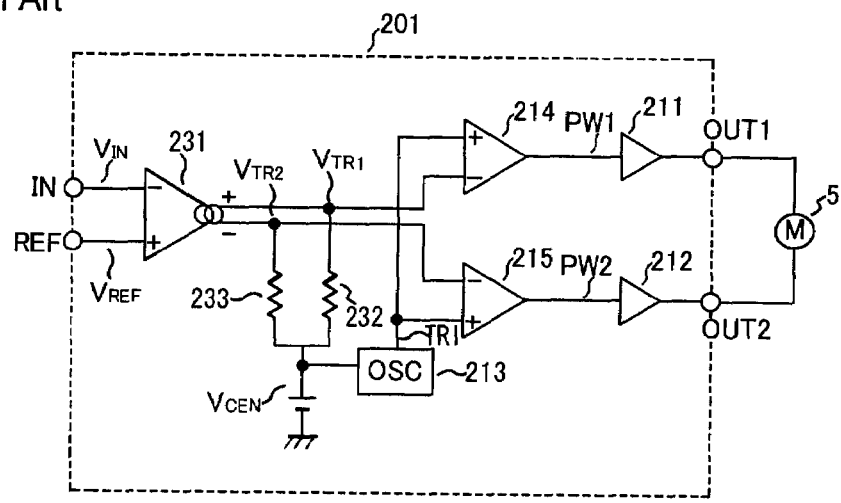
FIG. 11 is a circuit diagram of a coil load driving circuit intended to effect improvement in respect of the above-described conventional problem.
Figure 12:
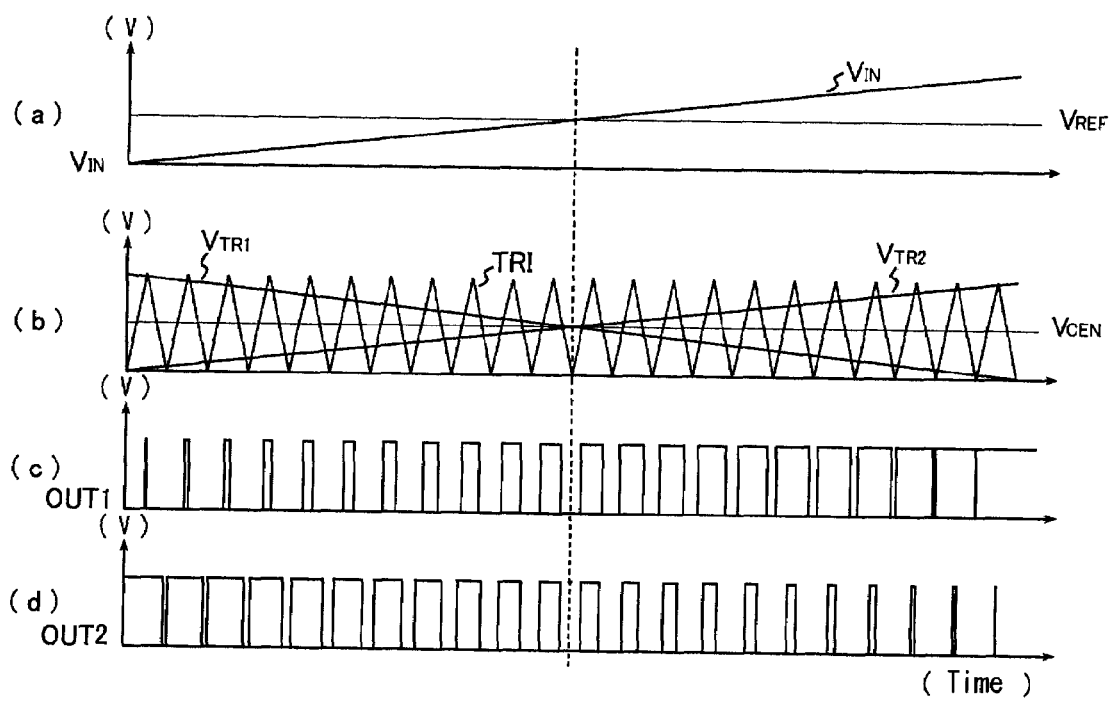
FIG. 12 is a waveform diagram showing the waveforms generated at the various sections of the conventional coil load driving circuit of FIG. 11.

Consequently, although it is preferable from the point of view of power consumption that, as in the case of the coil load driving circuits 1 and 2, the fixed potential of the output from the first output terminal $OUT_1$ or second output terminal $OUT_2$ should be ground potential, a modification is also possible in which the fixed potential is the power supply voltage Vcc. This is described below as a further preferred embodiment of the present invention. In the coil load driving circuit 3 shown in the circuit diagram of FIG. 5, the polarities of the input terminals of the first and second PWM comparators 14, 15 in the coil load driving circuit 1 are mutually interchanged, and the output PWM pulse synthesis circuit 16 is replaced by an output PWM pulse synthesis circuit 26 in which inverters 24 and 25 are added to invert the outputs of the AND circuits 22, 23. In this coil load driving circuit 3, as shown in the waveform diagram of FIG. 6, the pulse width of the PWM pulse that is output from the first output terminal $OUT_1$ gradually becomes larger when the input control voltage $V_{IN}$ is increased linearly, and is fixed at the power supply voltage Vcc when the input control voltage $V_{IN}$ becomes equal to or higher than the input reference voltage $V_{REF}$. In contrast, the pulse width of the PWM pulse that is output from the second output terminal $OUT_2$, when the input control voltage $V_{IN}$ is linearly increased, is fixed at the power supply voltage Vcc when the input control voltage $V_{IN}$ is lower than or equal to the input reference voltage $V_{REF}$, and gradually becomes smaller when the input control voltage $V_{IN}$ is higher than the input reference voltage $V_{REF}$. In the same way as in the case of the coil load driving circuit 1, the coil load driving circuit 3 makes it possible to minimize radiation noise generated by switching of the first and second output buffers 11, 12 when the motor 5 is in a stationary condition. Also, the coil load driving circuit 2 could be modified in the same way.

In this way, generation of radiation noise can be minimized by a coil load driving circuit according to the preferred embodiments of the present invention described above. Also, radiation noise is minimized in an optical disc device including such a coil load driving circuit and a coil load that performs focus adjustment or tracking adjustment and that is driven thereby, so the optical disc device can perform stable operation.

It should be noted that the present invention is not restricted to the preferred embodiments described above, and various design modifications are possible within the scope of the appended claims. For example, the same operation can be achieved even if the polarities of the input terminals of the voltage-current converter 17 of the coil load driving circuit 1 and the first and second PWM comparators 14, 15 are simultaneously interchanged. Also, various logical circuit configurations are of course possible that achieve synthesis of outputs in the same way as the output PWM pulse synthesis circuit 16 (or 26).

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A coil load driving circuit that drives a coil load in a positive or negative direction by applying a PWM pulse in accordance with a difference between an input control voltage and an input reference voltage to either terminal of the coil load, comprising:
    a transfer voltage generating circuit that inputs the input control voltage and the input reference voltage, and, depending on a difference thereof, outputs a first transfer voltage that increases and decreases about a center voltage of a triangular wave signal that is output by an oscillator and a second transfer voltage that increases and decreases oppositely to the first transfer voltage about the center voltage of the triangular wave signal that is output by the oscillator;
    a first PWM comparator that outputs a first PWM signal by comparing the first transfer voltage and the triangular wave signal;
    a second PWM comparator that outputs a second PWM signal by comparing the second transfer voltage and the triangular wave signal;
    an output PWM pulse synthesis circuit that outputs an AND signal of the first PWM signal with an exclusive OR signal of the first and second PWM signals and that outputs an AND signal of the second PWM signal with the exclusive OR signal of the first and second PWM signals;
    a first output buffer arranged to output a PWM pulse at one terminal of the coil load, being controlled by the AND signal of the first PWM signal and the exclusive OR signal; and
    a second output buffer arranged to output a PWM pulse at the other terminal of the coil load, being controlled by the AND signal of the second PWM signal and the exclusive OR signal.

2. The coil load driving circuit according to claim 1, wherein the transfer voltage generating circuit includes a voltage-current converter that outputs currents of both positive and negative polarity proportional to the difference between the input control voltage and the input reference voltage; and two bias resistors having first ends connected with the respective outputs of the voltage-current converter and second ends connected with the center voltage of the triangular wave signal;
    the voltages that are generated at the respective first ends of the bias resistors being designated as the first and second transfer voltages.

3. The coil load driving circuit according to claim 1, wherein the transfer voltage generating circuit includes a first inverting amplifier that delivers inverted output of the input control voltage with reference to the input reference voltage, and a second inverting amplifier that delivers inverted output of the output delivered by the first inverting amplifier;
    the center voltage of the triangular wave signal being made to coincide with the input reference voltage and the output of the first inverting amplifier being designated as the first transfer voltage, and the output of the second inverting amplifier being designated as the second transfer voltage.

4. The coil load driving circuit according to claim 1, wherein a ground potential is output at both terminals of a motor in a period outside a pulse period of the PWM pulse.

5. The coil load driving circuit according to claim 1, wherein the coil load is one of a rotating motor, a linear moving load, a curvilinearly moving load, and an actuator.

6. The coil load driving circuit according to claim 1, wherein the first and second output buffers include one of a P-type MOS transistor, an N-type MOS transistor, an NPN-type bipolar transistor, and a PNP-type bipolar transistor.

7. The coil load driving circuit according to claim 1, wherein the output PWM pulse synthesis circuit includes AND circuits.

8. The coil load driving circuit according to claim 7, wherein inverters are arranged in the output PWM pulse synthesis circuit to invert outputs of the AND circuits.

9. An optical disc device, comprising:
    the coil load driving circuit according to claim 1; and
    a coil load arranged to perform focus adjustment or tracking adjustment and to be driven by the coil load driving circuit.

* * * * *